United States Patent
Weckesser et al.

(10) Patent No.: US 10,363,534 B2
(45) Date of Patent: Jul. 30, 2019

(54) FLUIDIZED BED REACTOR FOR PRODUCING POLYCRYSTALLINE SILICON GRANULES AND METHOD FOR THE ASSEMBLY OF SUCH A FLUIDIZED BED REACTOR

(71) Applicant: Wacker Chemie AG, Munich (DE)

(72) Inventors: Dirk Weckesser, Mehring (DE);
Gerhard Forstpointner, Kastl (DE);
Harald Hertlein, Burghausen (DE)

(73) Assignee: WACKER CHEMIE AG, Munich (DE)

( * ) Notice: Subject to any disclaimer, the term of this patent is extended or adjusted under 35 U.S.C. 154(b) by 267 days.

(21) Appl. No.: 15/525,631

(22) PCT Filed: Nov. 3, 2015

(86) PCT No.: PCT/EP2015/075507
§ 371 (c)(1),
(2) Date: May 10, 2017

(87) PCT Pub. No.: WO2016/074978
PCT Pub. Date: May 19, 2016

(65) Prior Publication Data
US 2017/0320035 A1 Nov. 9, 2017

(30) Foreign Application Priority Data
Nov. 10, 2014 (DE) .......... 10 2014 222 865

(51) Int. Cl.
| | |
|---|---|
| B01J 8/18 | (2006.01) |
| C01B 33/027 | (2006.01) |
| C01B 33/029 | (2006.01) |
| C23C 16/24 | (2006.01) |

(52) U.S. Cl.
CPC .......... *B01J 8/1818* (2013.01); *B01J 8/1827* (2013.01); *B01J 8/1836* (2013.01); *B01J 8/1872* (2013.01); *C01B 33/027* (2013.01); *C01B 33/029* (2013.01); *C23C 16/24* (2013.01); *B01J 2208/00407* (2013.01); *B01J 2208/00902* (2013.01); *B01J 2219/00018* (2013.01)

(58) Field of Classification Search
CPC ...... B01J 8/1818; B01J 8/1872; B01J 8/1827; B01J 8/1836; B01J 2208/00902; B01J 2219/00018; B01J 2208/00407; C23C 16/24; C01B 33/029; C01B 33/027
See application file for complete search history.

(56) References Cited

U.S. PATENT DOCUMENTS

| | | | |
|---|---|---|---|
| 4,207,360 | A | 6/1980 | Padovani |
| 4,786,477 | A | 11/1988 | Yoon et al. |
| 4,900,411 | A | 2/1990 | Poong et al. |
| 7,029,632 | B1 | 4/2006 | Weidhaus et al. |
| 2008/0006617 | A1 | 1/2008 | Harris et al. |
| 2010/0044342 | A1 | 2/2010 | Kim et al. |

(Continued)

FOREIGN PATENT DOCUMENTS

CN 103373730 A 10/2013

*Primary Examiner* — Sarang Afzali
*Assistant Examiner* — Ruth G Hidalgo-Hernandez
(74) *Attorney, Agent, or Firm* — Brooks Kushman P.C.

(57) ABSTRACT

Assembly of a fluidized bed reactor for the preparation of polycrystalline silicon granules by chemical vapor deposition of silicon onto seed particles and removal of polycrystalline silicon granules is facilitated without breakage and with gas tightness by a specific assembly sequence.

1 Claim, 1 Drawing Sheet

(56) References Cited

U.S. PATENT DOCUMENTS

2011/0206866 A1 8/2011 Suzuki et al.
2012/0269686 A1 10/2012 Jung et al.
2013/0280533 A1 10/2013 Weckesser et al.

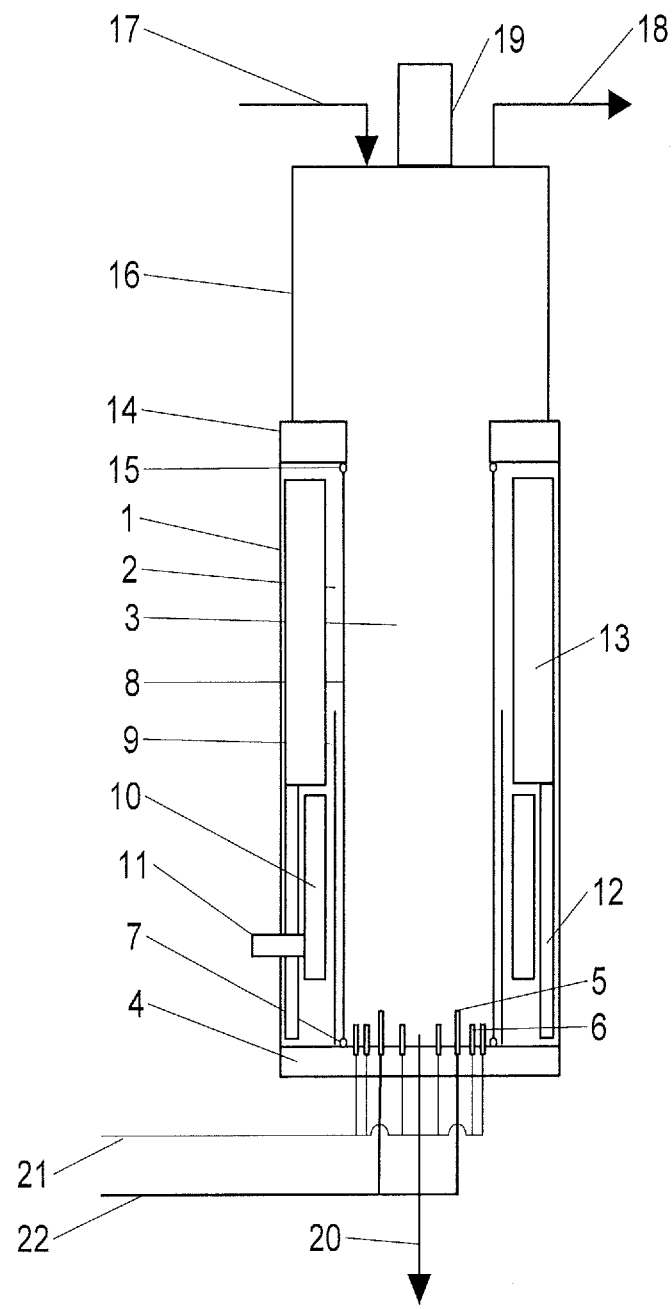

FLUIDIZED BED REACTOR FOR PRODUCING POLYCRYSTALLINE SILICON GRANULES AND METHOD FOR THE ASSEMBLY OF SUCH A FLUIDIZED BED REACTOR

CROSS REFERENCE TO RELATED APPLICATIONS

This application is the U.S. National Phase of PCT Appln. No. PCT/EP2015/075507 filed Nov. 3, 2015, which claims priority to German Application No. 10 2014 222 865.4 filed Nov. 10, 2014, the disclosures of which are incorporated in their entirety by reference herein.

BACKGROUND OF THE INVENTION

1. Field of the Invention

The invention relates to a fluidized bed reactor for producing polycrystalline silicon granules and a method for assembling such a fluidized bed reactor.

2. Description of the Related Art

Polycrystalline silicon granules are produced in a fluidized bed or fluid bed reactor. This is achieved by fluidizing silicon particles by means of a gas flow in a fluidized bed, wherein the fluidized bed is heated to high temperatures by a heating device. By adding a silicon-containing reaction gas, a deposition reaction proceeds on the hot particles surfaces. In this case, elemental silicon is deposited on the silicon particles and the individual particles grow in diameter. Through regular withdrawal of grown particles and addition of relatively small silicon seed particles, the method can be operated continuously with all the associated advantages. As silicon-containing reagent gases, silicon-halogen compounds (e.g. chlorosilanes or bromosilanes), monosilane (SiH4), and also mixtures of these gases with hydrogen are described.

U.S. Pat. No. 4,900,411 A discloses a method for obtaining high-purity polycrystalline silicon by precipitation of silicon on high-purity silicon particles from silicon-containing gas, such as silane, dichlorosilane, trichlorosilane or tribromosilane, characterized by a reactor having a fluidized bed into which a reaction gas is introduced together with silicon seed particles through an introduction tube, and microwaves are supplied in order to heat the fluidized particles in such a manner that polysilicon precipitates thereon.

U.S. Pat. No. 7,029,632 B2 discloses a fluid bed reactor having a pressure-bearing casing, an inner reactor tube which transmits heat radiation, an intake for silicon particles, a tubular intake for supplying a reaction gas which divides the fluid bed into a heating zone and a reaction zone lying thereabove, a gas distribution appliance for supplying a fluidizing gas to the heating zone, an outlet for incompletely reacted reaction gas, fluidizing gas and also the gaseous or vaporous products of the reaction, an outlet for the product, a heating device and also an energy supply for the heating device, wherein it is proposed that the heating device is a radiation source for heat radiation which is arranged outside the inner reactor tube and in a ring shape around the heating zone without direct contact with the reactor tube, and is constructed in such a way that it heats the silicon particles in the heating zone by means of heat radiation to a temperature such that the proper reaction temperature is set in the reaction zone. The heat zone and the reaction zone are separated vertically. This permits the fluid bed also to be heated with heating methods other than microwaves, since, in the heating zone, it is possible that no wall deposition can occur because no silicon-containing gas is present there. Heat radiation heating with flat heater elements is provided which introduces the heat evenly over the extent of the fluid bed and in a locally defined manner.

The heating device is constructed, for example, by heating elements made of doped silicon or graphite or silicon carbide, quartz tube radiators, ceramic radiators or metal wire radiators. Most preferably, the heating device is a serpentine-shaped slotted tube made of graphite having an SiC surface coating which is arranged in the reactor standing or suspended from the electrode connections.

U.S. Pat. No. 4,786,477 A discloses carrying out the method in a device comprising a reactor having a gas introduction tube for the reaction gas mixture at the bottom end, a gas outlet tube at the top end and also a feed tube for the silicon seed particles, characterized in that the reactor consisting of quartz is situated vertically upright on the center line of a heat generator, in which heat generator a microwave screening shield is installed in the central part and which is connected to the microwave generators via microwave supply tubes, wherein a gas distributor plate is arranged beneath the reactor and a gas barrier membrane is arranged within each microwave supply tube, and in that cooling channels are provided between the wall of the heat generator and the outer wall of the reactor, and also in the gas distribution plate.

In an embodiment of the device according to U.S. Pat. No. 4,786,477 A, the gas outlet projects outwards and is attached in loose form, wherein a graphite seal is situated on the connection site to the quartz reactor. The graphite seal is held by a holder which is situated on the side of the gas outlet and which is tensioned by a spring in an axial direction. The connection is thereby maintained in a sealing manner by the spring pressure on the quartz reactor via the holder, even if the reactor moves somewhat.

The upper part of the heat generator through which the gas outlet tube projects outwards is closed gas-tightly by a PTFE seal and a holder.

The gas introduction tube is connected to the bottom end of the heat generator and a gas distribution plate is introduced between the gas intake tube and the bottom end of the quartz reactor. A coolant path is formed in the gas distribution plate. An outlet tube for particles is connected to the bottom part of the quartz reactor and extends to a silicon collection vessel. A graphite seal prevents the escape of reaction gas at the site between the quartz reactor and the heat generator.

In another embodiment of the device, the upper end of the quartz reactor is directly connected to the gas outlet tube. The bottom end has a gas seal which prevents the reaction gas escaping from the heat generator, i.e. an O ring made of graphite introduced as seal between the flange of the heat generator and the flange of the quartz reactor and the gas distribution plate, in order that complete gas-tightness prevails.

It has been found that the sequence of assembly of the individual components of a fluidized bed reactor has a substantial influence on the functionality thereof. A substantial problem in this case is the gas-tightness of the reaction space. In addition, during the assembly damage to the reactor tube can occur.

An object of the present invention is to solve the problems identified above.

SUMMARY OF THE INVENTION

The problems are solved by a method for assembling a fluidized bed reactor for producing polycrystalline silicon granules, comprising the steps hereinafter in the stated sequence:

establish a base plate (4) and connect to gas supply lines for fluidizing gas (21) and reaction gas (22) and product take-off line (20), equip the base plate (4) with at least one fluidizing gas nozzle (6) and with at least one reaction gas nozzle (5), insert the bottom reactor tube seal (7)

establish a reactor tube (8) on the bottom reactor tube seal (7), position the reactor section (1) with heater (10), electrodes (11) and insulation sections (12, 13) over the reactor tube (8), establish an upper reactor tube clamp (14) with an upper reactor tube seal (15), assemble the reactor head (16)

assemble the seed feed appliance (17) and off-gas pipeline (18).

BRIEF DESCRIPTION OF THE DRAWINGS

FIG. 1 shows the schematic structure of an assembled fluidized bed reactor.

DETAILED DESCRIPTION OF THE PREFERRED EMBODIMENTS

The inventors have surprisingly and unexpectedly discovered that a deviation from the assembly sequence according to the invention can lead to the reaction tube being damaged and the reactor not being gastight in the reaction space.

In addition, it has proven impossible to assemble heater and insulation sections when the outer casing is already positioned. An assembly sequence is successful when the reaction tube is not damaged, the reactor is gastight and all heater and insulation parts are arranged correctly and functionally. In addition, by sufficient spacings between current-carrying components and insulation sections, a correspondingly sufficient insulation resistance is ensured.

First, the base plate is established and connected to the gas supply lines for fluidizing gas (e.g. hydrogen) and reaction gas (e.g. trichlorosilane).

In addition, the base plate is connected to the product take-off line, with which the polycrystalline silicon granules can be removed from the reactor.

Then, the base plate is equipped with the corresponding nozzles, at least with in each case one fluidizing gas nozzle and one reaction gas nozzle.

Then, the bottom reactor tube seal is inserted in the base plate. The reactor tube is established thereon.

Then, the reactor section with the heater, electrodes and insulation sections assembled therein is positioned over the reactor tube.

Then, the upper reactor tube clamp with the upper reactor tube seal is established.

On the upper reactor tube clamp with the upper reactor tube seal, the reactor head is mounted.

Finally, seed feed appliance and off-gas pipeline are mounted.

Preferably, measuring appliances are mounted on the reactor head. With the measuring appliances, preferably, the reactor overhead pressure and also, by means of a pyrometer through an inspection glass, the fluidized bed temperature are measured. In an embodiment, a camera recording is made through an inspection glass.

In an embodiment, a cylindrical component is worked around the established reactor tube before the reactor section is positioned. In this case, the reactor section is positioned over the cylindrical component, with the heater, electrodes and insulation sections assembled therein.

In the assembled state, the cylindrical component is situated between reactor tube and heating device.

The cylindrical component has openings on the cylindrical surface thereof, wherein at least 5%, and at most 95% of the cylindrical surface is open. The feature that at least 5% and at most 95% of the cylindrical surface of the cylindrical component is open, is taken to mean that a ratio of free surface (sum of the open surfaces) to the total cylindrical surface of the component is 5-95%. Preferably, this ratio is 40-70%, more preferably 45-60%. The openings can be slots, cutouts, meshes, bore holes etc. The component can have, for example the shape of a cylindrical grating. The component is preferably open at the top or the bottom or in both directions (bottom surface and cover surface of the cylinder). This facilitates disassembly of the reactor.

The heating device can be a serpentine-shaped heater or a multiplicity of heating elements or heating bars.

Preferably, the heating device consists of a plurality of heating elements concentrically arranged about the inner reactor tube. Between the heating elements and the inner reactor tube there is situated, in this case, preferably the component that is likewise concentrically arranged about the inner reactor tube.

Preferably, the component consists of a readily heat-conducting material. The heating energy is transferred to the component by heat radiation and heat conduction and brings said element to incandescence.

It is also preferred to use a component that consists of a material that is permeable to the radiation energy of the heating device.

Preferably, the heating elements are situated in openings of the cylindrical surface of the component. The openings can be cutouts in which the heating bars are situated.

Preferably, the component comprises a material selected from the group consisting of graphite, CFC, silicon, SiC and quartz glass. The component can consist of one or more of said materials. Likewise, the component can be coated with one or more of said materials.

It has surprisingly been shown that the use of an above-mentioned component between heating device and reactor tube, in addition to harmonization of the temperature, is also suitable for protecting the heating device when the reactor is being moved out.

In the prior art, as a result of reactor tube break up, damage to the heating elements also occurred. This can be avoided by the present invention. The component is insensitive to fracturing parts of the reactor tube and can be reused.

In addition, in contrast to the prior art, there is no radiation shield, since the component has openings and therefore the energy input into the fluidized bed proceeds in an economic manner.

The invention also relates to a fluidized bed reactor for producing polycrystalline silicon granules, comprising a reactor section (1), a reactor head (16), a reactor tube (8) and a base plate (4) within the reactor section (1), wherein, between an outer wall of the reactor tube (8) and an inner wall of the reactor section (1), an intermediate shell (2) is situated, further comprising at least one heater (10) within the intermediate shell (2), which is connected to an electrode (11), at least one fluidizing nozzle (6) for supplying fluidizing gas, and at least one reaction gas nozzle (5) for supplying reaction gas, a seed feed appliance (17) to feed silicon seed particles, a product take-off line (20) for polycrystalline silicon granules and also an off-gas pipeline (18) for removing reactor off-gas, wherein the reactor tube (8) is sealed against the base plate (4) and also against an upper reactor tube clamp (14) by means of seals (7, 15) in such a manner that the reactor tube is gastight, additionally comprising insulation sections (12, 13) in the heated and unheated regions of the intermediate shell (2).

Assembly of the fluidized bed reactor should proceed according to the abovedescribed method according to the invention, since the assembly sequence defined therein ensures that the assembly proceeds in an error-free manner and without damage and the fluidized bed reactor is gastight.

Preferably, the fluidized bed reactor also comprises an abovedescribed cylindrical component (9) between reactor tube (8) and heater (10) that has openings on the cylindrical surface thereof, wherein at least 5%, and at most 95% of the cylindrical surface is open.

Preferably, the fluidized bed reactor additionally comprises measuring appliances (19) that are mounted on the reactor head (16). With the measuring appliances, preferably, the reactor overhead pressure and also, by means of a pyrometer through an inspection glass, the fluidized bed temperature are measured. In an embodiment, camera recording is made through an inspection glass.

The reactor tube preferably consists of a high-purity and high-temperature-resistant material, in particular quartz glass, SiN or SiC, wherein the reactor tube can also be CVD-coated, at least on the side facing the reaction.

The assembly instructions according to the invention ensure sufficient tightness of the reaction region with respect to the intermediate shell and sufficient tightness of the pressure-bearing casing (reactor section) with respect to the environment. It is ensured that during assembly, the reactor tube is not damaged under usual conditions. Insulation components, electrodes and heaters may be correctly fastened. A sufficiently high insulation resistance can be ensured.

After assembly of the fluidized bed reactor, polycrystalline silicon granules can be produced therewith by fluidizing silicon seed particles by means of a gas flow in a fluidized bed heated by means of a heating device, wherein by addition of a silicon-containing reaction gas, polycrystalline silicon is deposited on the hot silicon seed particles surfaces, whereby the polycrystalline silicon granules form. Preferably, the resultant polycrystalline silicon granules are then removed from the fluidized bed reactor. Preferably, the method is operated continuously by removing from the reactor particles that have grown in diameter by deposition and adding fresh silicon seed particles.

Preferably, trichlorosilane is used as silicon-containing reaction gas. The temperature of a fluidized bed in the reaction region is 850-1400° C. in this case.

It is likewise preferred to use monosilane as silicon-containing reaction gas. The temperature of the fluidized bed in the reaction region is preferably 550-850° C.

It is further preferred to use dichlorosilane as silicon-containing reaction gas. The temperature of the fluidized bed in the reaction region is preferably 600-1000° C.

The fluidizing gas is preferably hydrogen.

The reaction gas is injected into the fluidized bed via one or more nozzles. The local gas velocities at the exit of the nozzles is preferably 0.5 to 200 m/s.

The concentration of the silicon-containing reaction gas, based on the total amount of gas flowing through the fluidized bed, is preferably 5 mol % to 50 mol %, more preferably 15 mol % to 40 mol %.

The concentration of the silicon-containing reaction gas in the reaction gas nozzles, based on the total amount of gas flowing through the reaction gas nozzles, is preferably 20 mol % to 80 mol %, more preferably 30 mol % to 60 mol %. Trichlorosilane is preferably used as silicon-containing reaction gas.

The reactor pressure is 0 to 7.0 bar gauge pressure, preferably 0.5 to 4.5 bar gauge pressure.

In a reactor having a diameter of, e.g. 400 mm, the mass flow rate of silicon-containing reaction gas is preferably 200 to 600 kg/h. The hydrogen volumetric flow rate is preferably 100 to 300 $Nm^3/h$. For larger reactors, larger amounts of silicon-containing reaction gas and $H_2$ are preferred.

It is clear to a person skilled in the art that some process parameters are ideally selected in dependence on the reactor size. Therefore, hereinafter, operating data normalized to the reactor cross-sectional area are cited in which the method according to the invention is preferably employed.

The specific flow rate of silicon-containing reaction gas is preferably 1600-6500 $kg/(h*m^2)$.

The specific hydrogen volumetric flow rate is preferably 800-4000 $Nm^3/(h*m^2)$.

The specific bed weight is preferably 700-2000 $kg/m^2$.

The specific silicon seed particle metering rate is preferably 7-25 $kg/(h*m^2)$.

The specific reactor heating power is preferably 800-3000 $kW/m^2$.

The residence time of the reaction gas in the fluidized bed is preferably 0.1 to 10 s, particularly preferably 0.2 to 5 s.

The features cited with respect to the abovementioned embodiments of the method according to the invention can be applied correspondingly to the device according to the invention. Conversely, the features cited with respect to the abovementioned embodiments of the device according to the invention can be applied correspondingly to the method according to the invention. These and other features of the embodiments according to the invention are explained in the description of the figures and in the claims. The individual features can be realized as embodiments of the invention either separately or in combination. In addition, they can describe advantageous embodiments which are independently patentable.

LIST OF REFERENCE SIGNS

1 Reactor section
2 Intermediate shell
3 Reaction space
4 Base plate
5 Reaction gas nozzles
6 Fluidizing nozzles
7 Bottom reactor tube seal
8 Reactor tube
9 Cylindrical component
10 Heater
11 Electrodes
12 Insulation of heating region
13 Insulation in the unheated region
14 Upper reactor tube clamp
15 Upper reactor tube seal
16 Reactor head
17 Seed feed appliance
18 Off-gas pipeline 19 Measuring appliances
20 Product take-off line
21 Fluidizing gas supply
22 Reaction gas supply The fluidized bed reactor comprises a reactor section 1 into which a reactor tube 8 is inserted and which is delimited at the top by the reactor head 16 and at the bottom by the base plate 4.

Between an inner wall of the reactor section 1 and the outer wall of the reactor tube 8 is situated an intermediate shell 2. This intermediate shell 2 comprises heaters 10 which are connected to electrodes 11, and also insulation material, namely insulation 12 in the heating region and insulation 13 in the unheated region.

The intermediate shell 2 is filled with an inert gas, or is purged with an inert gas. The pressure in the intermediate shell 2 can be higher than in the reaction space 3 which is delimited by the walls of the reactor tube 8.

In the interior of the reactor tube 8 there is situated the fluidized bed of polysilicon granules.

As feed gases, the fluidizing gas is supplied to the reactor via fluidizing nozzles 6 and the reaction gas mixture via reaction gas nozzles 5.

The height of the reaction gas nozzles 5 can differ from the height of the fluidizing nozzles 6.

A cylindrical component 9 is worked onto the reactor tube 8 in order in the case of certain reactor structures and processes, to protect the heater during removal and to harmonize the temperature.

The reactor head 16 can have a larger cross section than the fluidized bed. The reactor head 16 is fixed to the upper reactor tube clamp 14.

Seed is fed to the reactor at the reactor head 16 via a seed feed appliance 17.

The polycrystalline silicon granules are withdrawn via a product take-off line 20 at the base plate 4.

At the reactor head 16, the reactor off-gas is taken off by means of an off-gas pipeline 18.

The reactor tube 8 is sealed against the base plate 4 and also against the upper reactor tube clamp 14 by means of seals, namely the bottom reactor tube seal 7 and the upper reactor tube seal 15, in such a manner that the reactor tube is gastight.

In addition, measuring appliances 19 are mounted at the reactor head 16. With the measuring appliances 19, preferably, the reactor overhead pressure and also, by means of a pyrometer through an inspection glass, the fluidized bed temperature are measured. In an embodiment, a camera recording is made through an inspection glass.

The above description of exemplary embodiments is to be taken to be by way of example. The disclosure made thereby permits a person skilled in the art, firstly to understand the present invention and the associated advantages, and, secondly, also comprises, in the understanding of a person skilled in the art, obvious amendments and modifications of the described structures and methods. Therefore, all such amendments and modifications and also equivalents shall be covered by the scope of protection of the claims.

The invention claimed is:

1. A method for assembling a fluidized bed reactor for producing polycrystalline silicon granules, comprising the steps hereinafter in the stated sequence:
   a) provide a base plate and connect the base plate to gas supply lines for fluidizing gas and reaction gas and a product take-off line;
   b) equip the base plate with at least one fluidizing nozzle and with at least one reaction gas nozzle;
   c) insert a bottom reactor tube seal into the base plate;
   d) position a reactor tube on the bottom reactor tube seal;
   e) position a reactor section with heater, electrodes and insulation sections over the reactor tube;
   f) provide an upper reactor tube clamp with an upper reactor tube seal;
   g) assemble the reactor head; and
   h) assemble a seed feed appliance and off-gas pipeline.

* * * * *